United States Patent [19]
Beaussier et al.

[11] Patent Number: 5,361,045
[45] Date of Patent: *Nov. 1, 1994

[54] HIGH-STABILITY RESONATORS OF SOLID ELASTIC MATERIAL AND OSCILLATORS USING THEM

[75] Inventors: Jacques Beaussier, Wissous; Michel Breuzet, La Garenne Colombes; Michel Gay, Fresnes; Jean Uebersfeld, Paris, all of France

[73] Assignee: Office National d'Etudes et de Recherches Aerospatiales styled O.N.E.R.A., Chatillon, France

[*] Notice: The portion of the term of this patent subsequent to May 1, 2007 has been disclaimed.

[21] Appl. No.: 327,839

[22] Filed: Mar. 23, 1989

[30] Foreign Application Priority Data

Mar. 24, 1988 [FR] France .................. 88 03864

[51] Int. Cl.[5] .................. H01L 41/00; H03B 5/30
[52] U.S. Cl. .................. 331/154; 310/15; 310/348; 310/357; 310/366; 310/368; 331/163
[58] Field of Search ........ 331/116 R, 116 FE, 116 M, 331/154, 155, 156, 158, 163; 310/15, 36, 345, 348, 357, 360, 361, 365, 366, 367, 368

[56] References Cited

U.S. PATENT DOCUMENTS

2,998,575  8/1961  Mason .................. 331/158 X
4,567,451  1/1986  Greenwood .................. 331/155

FOREIGN PATENT DOCUMENTS

2143103  3/1972  Germany .................. 331/154

Primary Examiner—Siegfried H. Grimm
Attorney, Agent, or Firm—Lowe, Price, LeBlanc & Becker

[57] ABSTRACT

A preferred embodiment of a resonator embodying the invention comprises essentially a resonating plate, an action electrode and a detection electrode, and a supporting base. The electrodes are placed facing symmetrical narrow edges of the plate, opposite vibration loops, and are coupled to the plate by capacitive, electrostrictive or piezoelectric effect according to the material of which the plate is comprised. A very wide range of elastic solid materials can be used to embody the resonating plate. The plate is attached to the supporting base at points corresponding to vibration nodes of the plate. The plate vibrates advantageously according to a contour mode called Lamé mode. High coefficients of quality in the region of $10^7$ are obtained. The resonators embodying the invention can be easily integrated. To do so, the plate is e.g. embodied in silicon. Such a resonator is included in a high-stability oscillating loop comprising a phase shifter and an amplifier.

14 Claims, 2 Drawing Sheets

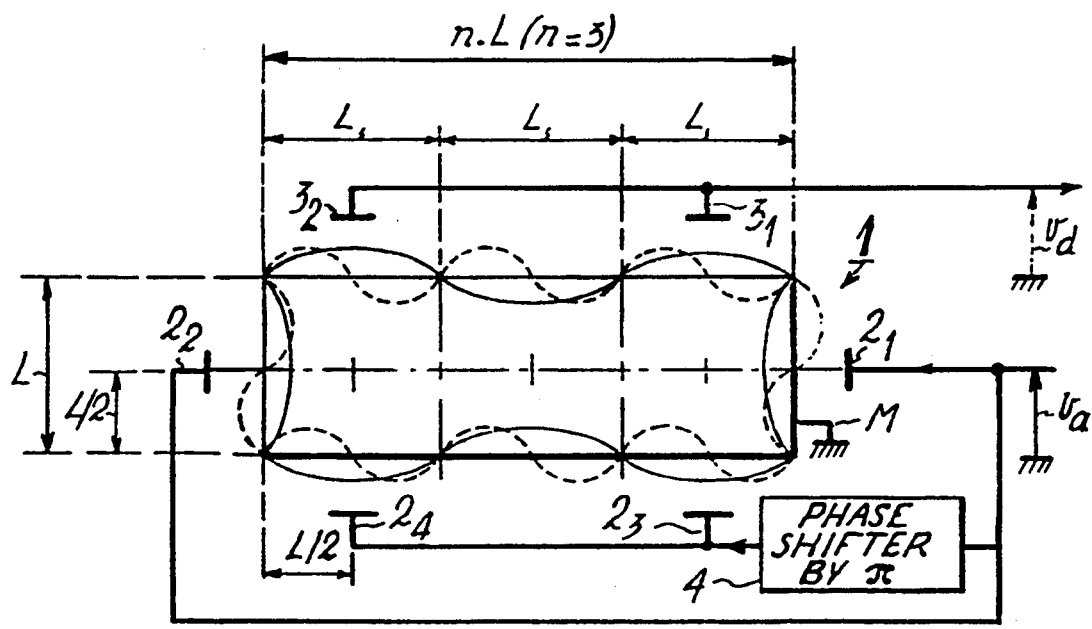
FIG. 1
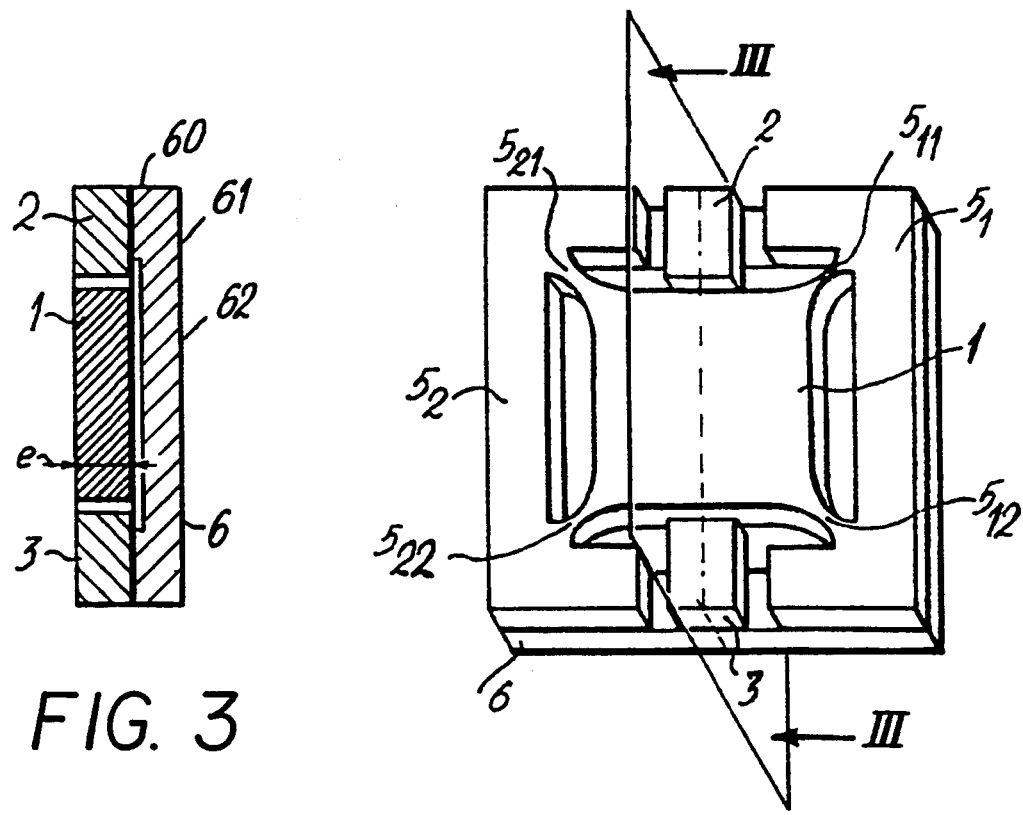
FIG. 3
FIG. 2

HIGH-STABILITY RESONATORS OF SOLID ELASTIC MATERIAL AND OSCILLATORS USING THEM

BACKGROUND OF THE INVENTION

1. Field of the Invention

This invention relates, in a general way, to resonators and oscillators for their implementation. More specifically, the invention relates to high-stability resonators and oscillators in the low and medium frequency range.

2. Description of the Prior Art

The currently most efficient high-stability oscillators mainly use resonators in piezoelectric material, principally quartz. Other piezoelectric materials such as berlinite are also used. In this type of resonator in piezoelectric material, the piezoelectric effect is an easy means for converting the energy from an electric field applied to the piezoelectric material into mechanical work. For high-stability quartz resonator oscillators, the relative frequency deviation is at best in the region of $10^{-10}$. In the case of the "down-market" quartz resonator oscillators widely used in electronic equipment, the relative frequency deviation is between $10^{-5}$ and $10^{-7}$. This relative frequency deviation is largely due to the resonator time drifts and depends on environmental conditions such as temperature.

The quartz resonator drifts are partly inherent to the material used, i.e. quartz. Tests have shown up the limitations of quartz which is the best of the known piezoelectric materials. Quartz, and all crystalline materials in general, have structure defects and impurities in the interstitial channels. The relative mobility of these impurities in the interstitial channels provokes frequency time drifts and excessive sensitivity to ionizing radiations, particularly when the quartz is excited in the flexural mode. High-stability quartz resonators require the use of very high quality quartz. It is becoming difficult at present to find natural quartz of sufficiently high quality. The synthesis of artificial quartz has not been fully mastered.

Furthermore, the sensitivity of quartz to temperature variations imposes the use of expensive thermostat-fitted enclosures for these high-stability oscillators.

OBJECTS OF THE INVENTION

The main object of this invention is to provide high-stability resonators that can be embodied with any elastic solid material, in order to remedy the limitations inherent to crystalline structures and to obviate the disadvantages of the prior art.

A further object of the invention is to provide high-stability oscillators for the implementation of the resonators embodying the invention.

SUMMARY OF THE INVENTION

Accordingly, a resonator embodying the invention comprises a supporting base, a resonating plate attached to said supporting base, one or more first electrodes and one or more second electrodes to respectively excite said plate in a contour vibration mode and to detect plate vibrations. The plate is made of elastic solid material, has a length which is a multiple integer of the width of the plate and is attached to the supporting base at points corresponding to vibration nodes of the plate. The electrodes do not adhere to the plate and are placed at the periphery of the plate and at a short predetermined distance from the plate, facing narrow edges of the plate and opposite vibration loops.

An oscillator embodying the invention comprises essentially a resonator as above defined, phase shifting means and amplifying means connected in a loop. The oscillator can also comprise means for DC biasing electrodes of the resonator, means connected at input to the second electrodes of the resonator for producing a signal representative of a capacitance variation between said electrodes and a reference ground, said capacity variation being due to vibrations of tile resonating plate of the resonator, and means connected in cascade with the producing means for dividing by two the frequency of the capacitance variation representative signal.

The resonators embodying the invention enable the embodiment of high-stability oscillators in the 50 to 500 kHz frequency range. A multiplying circuit can be associated with the oscillator when the desired frequency is greater than 500 kHz, For numerous applications the signal produced by an oscillator embodying the invention can be used directly, without processing by frequency dividing circuits as is often required for quartz oscillators operating in the 5 to 10 MHz range.

A particular embodiment of a resonator embodying the invention using silica glass, an amorphous insulating material, enabled a coefficient of quality in the region of $10^7$ to be achieved at a resonance frequency of 50 kHz.

Furthermore, the use of silicon for the embodiment of the resonator easily enables the complete integration of an oscillator of very small size in a solid-state or hybrid integrated circuit.

BRIEF DESCRIPTION OF THE DRAWING

The foregoing and other objects, features and advantages of the invention will be apparent from the following detailed description of several embodiments of the invention with reference to the corresponding accompanying drawings in which:

FIG. 1 is a schematic representation of a resonator embodying the invention;

FIG. 2 is a perspective view of a first preferred embodiment of a resonator comprising a square resonating plate and two electrodes;

FIG. 3 is a cross-section taken along the plane III—III in FIG. 2;

DESCRIPTION OF THE PREFERRED EMBODIMENTS

Figure 5:
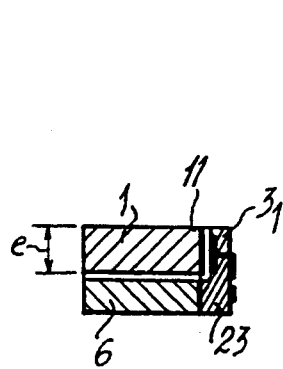
FIG. 5 is a cross-section taken along the plane V—V in FIG. 4.

In reference to FIG. 1, a resonator embodying the invention comprises a parallelepiped plate 1 of thickness e, of width L and of length n.L, whereby n is an integer equal to or greater than 1, in this case equal to 3, one or more action electrodes $2_1$ to $2_4$ and one or more detection electrodes $3_1$ and $3_2$.

The plate 1 is made of elastic solid material. Different types of materials can be used, conducting, semi-conducting or insulating, amorphous or cristallized, piezoelectric or otherwise. Such a plate of parallelepiped structure excited by volume acoustic waves in the contour mode of vibration presents resonances for different vibration frequencies. In order to excite a contour mode in the plate 1, the action electrodes $2_1$ to $2_4$ are placed at the periphery of the plate 1 facing narrow edges of thickness e of the plate 1, and an action signal $v_a$ intended to excite the plate is applied to the electrodes $2_1$ to $2_4$. For a plate 1 made of isotropic material, the thickness e is of no consequence as it has no bearing on the vibration mode, For a plate 1 with an anisotropy in the direction of the thickness e, the thickness e must be slight so as to reduce the effects of the anisotropy, Tests carried out with different types of materials have shown that the Lamé mode according to which the waves are radiated in directions at an angle of 45° from the narrow edges of the plate 1 is an interesting mode of excitation as regards the high quality coefficients obtained. The resonators embodying the invention described hereafter operate in the Lamé mode. It is possible to use other contour modes within the framework of the invention.

Deformations of the plate 1 excited in the Lamé mode at a fundamental frequency of resonance $F_0$ are shown in continuous fine lines in FIG. 1. Deformations of the plate 1 excited at a first harmonic resonance frequency $2F_0$ are shown in discontinuous fine lines. The action and detection electrodes $2_1$ to $2_4$ and $3_1$ and $3_2$ are positioned at the periphery of the plate 1 opposite the vibration loops. To avoid disturbing the vibrations of the plate 1, the electrodes $2_1$ to $2_4$, $3_1$ and $3_2$ do not adhere to the surface of the narrow edges of the plate 1; the electrodes are placed a short distance from the plate 1, typically at a distance in the region of 100 µm.

The action and detection electrodes $2_1$ to $2_4$ and $3_1$ and $3_2$ shown in FIG. 1 are positioned for a resonance of the plate 1 at fundamental frequency $F_0$. This position is provided as an example, other positions being possible. The electrodes $2_1$ and $2_2$ are symmetrically positioned at half width L/2 according to a longitudinal axis of the plate 1, respectively opposite first and second narrow edges at the ends of the plate 1. The electrodes $2_3$ and $2_4$ are positioned opposite a first longitudinal narrow edge of the plate 1; electrodes $2_3$ and $2_4$ are separated from one another by a distance equal to 2L and are respectively at distances equal to L/2 from the first and second narrow edges at the ends of the plate. The electrodes $2_1$ and $2_2$ are positioned facing vibration loops which are phase shifted by $\pi$ by comparison with the vibration loops where are positioned the electrodes $2_3$ and $2_4$. To compensate this phase shifting, a phase shifter by $\pi$, 4, is provided. The electrodes $2_1$ and $2_2$ receive directly the action signal $v_a$ through the phase shifter 4.

The detection electrodes $3_1$ and $3_2$ are positioned opposite a second longitudinal narrow edge of the plate 1 parallel to the first longitudinal narrow edge, symmetrically by comparison with the action electrodes $2_3$ and $2_4$ and respectively at distances equal to L/2 from the first and second narrow edges at the ends of the plate. The electrodes $3_1$ and $3_2$ issue a signal $v_d$ representative of the vibrations of the plate 1.

The plate 1 of area 3L×L has 11 vibration nodes when it resonates at fundamental frequency $F_0$, 3 nodes respectively located at the centers of the 3 squares L×L inscribed in the plate 1, 4 nodes respectively located in the 4 corners of the plate 1, 2 nodes located on the first longitudinal narrow edge of the plate 1 respectively at distances equal to L from the first and second narrow edges at the ends of the plate 1, and 2 nodes located on the second longitudinal narrow edge respectively at distances equal to L from the first and second narrow edges at the ends of the plate. To minimize perturbance of the resonance of the plate 1 and to obtain high coefficients of quality, the plate 1 is preferably attached to a supporting base at points corresponding to the vibration nodes.

According to the type of material constituting the plate 1, different physical effects operate to induce vibrations in the plate 1 from the action electrodes $2_1$ to $2_4$ and to detect the vibrations of the plate 1 by means of the detection electrodes $3_1$ and $3_2$.

In the case of a plate 1 made of conductive material, e.g. such as duralumin (Au4G), the physical effect operating is the capacitive effect. The capacitive effect is also used in the event of the plate 1 being made of semiconductive material, a surface doping of the plate 1 ensuring its conductivity. The action signal $v_a$ is then applied between the action electrodes $2_1$ to $2_4$, and the plate 1 is connected to a grounding terminal M as shown in FIG. 1. Likewise, the detected signal $v_d$ is supplied between the detection electrodes $3_1$ and $3_2$ and the grounding terminal M.

In the event of the plate 1 being made of a non-piezoelectric insulating material, amorphous or crystallized, the capacitive and electrostrictive effects can be used. If the narrow edges of the plate 1 opposite the electrodes are metallized and connected to the grounding terminal M, the effect operating is essentially the capacitive effect. If the narrow edges of the plate 1 are not metallized, a metallic reference ground, e.g. the supporting base, is connected to the grounding terminal M in such a way that lines of the electric field produced by the action signal $v_a$ traverses the insulating material. In this last case, the capacitive and electrostrictive effects operate.

Likewise, when the plate 1 is made of piezoelectric insulating material, the narrow edges of the plate 1 opposite the electrodes can be metallized and connected to the grounding terminal M, or can be non-metallized in which case a metallic reference ground such as the supporting base is connected to the grounding terminal M. In the former case, the capacitive effect operates. In the latter, it is essentially the piezoelectric effect which operates.

When the capacitive and electrostrictive effects are the operative effects, the relation between the voltage v at an action or detection electrode and the forces in the plate 1 is expressed by the equality:

$f = \alpha . v^2$, whereby $\alpha$ is a meter constant.

Supposing a sinusoidal voltage $v = V.\cos\omega t$, V and $\omega$ being respectively the maximum amplitude and the angular velocity of voltage v, the forces in the plate 1 are expressed by:

$$f = \alpha. V^2.(1 + \cos 2\omega t)/2.$$

This last equality thus shows that the plate 1 vibrates at a frequency $F = \omega/\pi$ which is twice the frequency $\omega/2\pi$ of the voltage v.

To linearize the voltage-force relation, an electrode can be biased at a d.c. voltage U. The forces in the plate 1 become:

$$f = \alpha.(U + V.\cos\omega t)^2 = \alpha.(U^2 + 2.U.V\cos\omega t + V^2.\cos^2\omega t).$$

The linearization of the voltage-force relation is obtained with the term $2.U.V.\cos\omega t$.

When the piezoelectric effect is predominant, there is no need to polarize the electrodes as this effect is linear.

When the plate 1 is in an isotropic material, the fundamental frequency of resonance $F_0$ is expressed:

$F_0 = v_t.(2)^{\frac{1}{2}}/(2.L)$, whereby $v_t$ is the speed of the transverse waves in the plate 1.

When the plate 1 is comprised of an anisotropic cristalline material, a judicious orientation of the axes of the plate 1 must be selected with regard to the crystallographic axes of the material so that the Lamé mode in such a plate continues to have a nodal structure analogous to the nodal structure obtained in an isotropic material.

In this way, e.g. when the plate 1 is in a cristalline material of the cubic system such as silicon or germanium, the plane of area nLxL of the plate 1 must be normal at a first cristallographic axis x of the material and the edges of the plate 1 must be parallel or at an angle of 45° to second y and third z cristallographic axes of the material. Two cutting angles at 0° and 45° to second and third axes y and z are therefore possible; these two cutting angles at 0° and 45° determine two different fundamental frequencies of resonance.

In the case of a cutting angle of 0°, the fundamental frequency of resonance $F_0$ is given by the relation:

$$F_0 = (C_{11} - C_{12})^{\frac{1}{2}}/(2.L.\rho)^{\frac{1}{2}}.$$

In the case of a cutting angle of 45°, this same frequency is given by the relation:

$$F_0 = (C_{66})^{\frac{1}{2}}/(2.L.\rho)^{\frac{1}{2}}.$$

In the relations above, $\rho$ represents the density of the material and $C_{11}$, $C_{12}$ and $C_{66}$ represent the components $C_{ij}$ of the rigidity tensor of the material constituting the plate 1, respectively of indices $(i, j) = (1, 1)$, $(i, j) = (1, 2)$ and $(i, j) = (6, 6)$.

When the plate 1 is e.g. in quartz, a piezoelectric material, the plate 1 must be cut in such a way that its plane of area nLxL corresponds to an isotropic plane of the quartz. In these conditions and for a plate 1 of slight thickness, the fundamental frequency of resonance $F_0$ is given by the same relation as for anisotropic material:

$$F_0 = v_{tp}.(2)^{\frac{1}{2}}/(2.L),$$

whereby $v_{tp}$ is the speed of the transverse waves in the quartz plate given by the relation:

$$v_{tp} = (((C_6 - C_{14}^2/C_{44}))/\rho)^{\frac{1}{2}},$$

$\rho$ being the density of the quartz.

In reference to FIGS. 2 and 3, a first preferred embodiment of the resonator embodying the invention comprises a square plate 1 of area LxL, an action electrode 2 and a detection electrode 3, two fastening lugs $5_1$ and $5_2$, and a supporting plate 6.

The plate 1 and the fastening lugs $5_1$ and $5_2$ constitue a single piece cut out of a slab of silicon. The fastening lugs $5_1$ and $5_2$ are U-shaped and surround the plate 1.

Four tongues $5_{11}$, $5_{12}$, and $5_{21}$, $5_{22}$ respectively connect four corners of the plate 1 to two internal corners of the fastening lug $5_1$ and to two internal corners of the fastening lug $5_2$.

The supporting base 6 is in an insulating material such as ceramic. Supporting base 6 is e.g. the ceramic support of a hybrid integrated circuit in which the resonator embodying the invention is integrated. The fastening lugs $5_1$ and $5_2$ and the electrodes 2 and 3 are attached by glueing to a peripheral edge 60 of the supporting base 6 slightly overhanging, typically by 100 μm, a central upper side 61 of the supporting base 6. The electrodes 2 and 3 are aligned in a plane of symmetry III—III of the resonator, respectively opposite two parallel narrow edges of the plate 1. The fastening lugs $5_1$ and $5_2$ are symmetrically located on both sides of the plane III—III. The upper side 61 of the supporting base 6 comprises a metallized part 62 which is intended to be connected below the plate 1 in such a way that the plate 1 is traversed by the lines of an electric field induced by the action signal $v_a$ applied to the action electrode 2.

Figure 4:
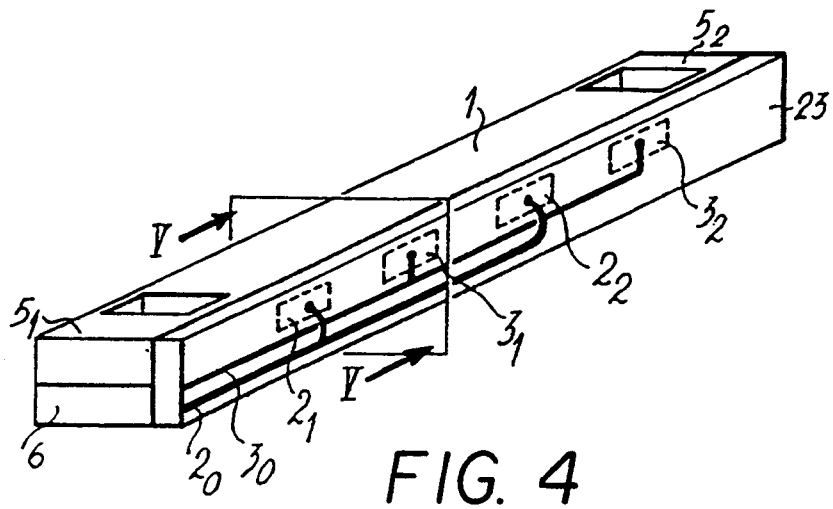
FIG. 4 is a perspective view of a second preferred embodiment of a resonator comprising a rectangular resonating plate and four electrodes.

In reference to FIGS. 4 and 5, a second preferred embodiment of the resonator embodying the invention comprises a rectangular plate 1 of area nLxL, in this case $n=4$, a block of electrodes 23, two fastening lugs $5_1$ and $5_2$, and a supporting plate 6.

As in the first preferred embodiment described previously, the plate 1 and the fastening lugs $5_1$ and $5_2$ constitue a single piece. This single piece is in silica glass for this embodiment. Foyer tongues at the four corners of the rectangular plate 1 connect the plate 1 to the fastening lugs $5_1$ and $5_2$. The fastening lugs $5_1$ and $5_2$ are respectively attached by glueing to two extremities of the supporting plate 6. A longitudinal narrow edge 11 of the plate 1 opposite the block of electrodes 23 is metallized so as to be connected to the reference ground.

The block of electrodes 23 which is e.g. a rigid two-sided printed circuit, supports two action electrodes $2_1$ and $2_2$ and detection electrodes $3_1$ and $3_2$. The electrodes $2_1$, $2_2$, $3_1$ and $3_2$ are situated in a first side of the block 23; they are aligned facing the metallized narrow edge 11 of the plate 1 and respectively opposite four vibration loops of the plate 1 when the latter vibrates at the fundamental frequency of resonance $F_0$. The block 23 is glued at extremities to the fastening lugs $5_1$ and $5_2$ of the plate 1 and on a lower side to a longitudinal narrow edge of the supporting base 6. A second side of the block 23 comprises two printed conductive bands $2_0$ and $3_0$ to which are respectively connected the action electrodes $2_1$ and $2_2$ and the detection electrodes $3_1$ and $3_2$. In this second embodiment the action $v_a$ and detection $v_d$ signals are phase shifted by $\pi$.

Figure 6:
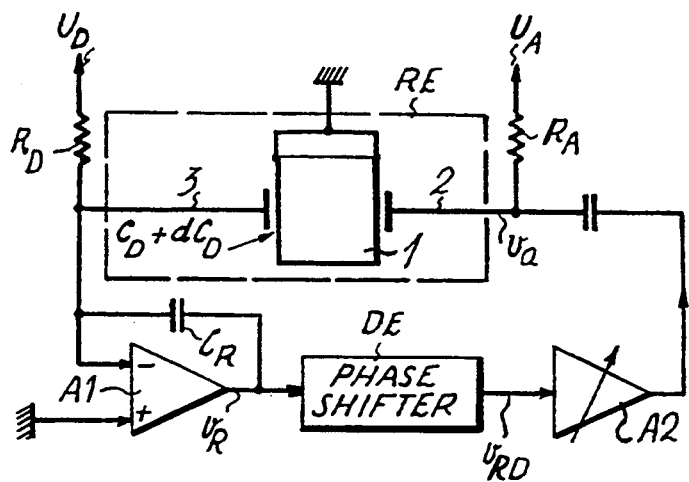
FIG. 6 is a circuit diagram of a first preferred embodiment of an oscillator embodying the invention in which action and detection electrodes of the resonator are biased with d.c. voltages.

In reference to FIG. 6, a first high-stability oscillator implementing a resonator embodying the invention RE, further comprises two bias resistors $R_D$ and $R_A$, a first amplifier A1, a phase shifter DE, and a second amplifier A2.

The resonator RE comprises a square plate 1, an action electrode 2 and a detection electrode 3. The electrodes 2 and 3 are respectively placed opposite two metallized parallel narrow edges of the plate 1; these narrow edges are connected to the reference ground. The detection electrode 3 and the metallized narrow edge opposite it form a capacitor of capacitance $C_D$ having an electrodynamic capacitance variation $dC_D$ when the plate 1 is vibrating.

The polarization resistor $R_A$ has a first terminal connected to the action electrode 2 and to an output of the amplifier A2, and a second terminal to which a first bias d.c. voltage $U_A$ is applied. The bias resistor $R_D$ has a first terminal connected to the detection electrode 3 and to an inverse input—of the amplifier A1, and a second terminal to which a second bias d.c. voltage $U_D$ is applied.

The amplifier A1 is of the operational amplifier type. Amplifier A1 comprises a direct input +connected to the reference ground and a capacitor $C_R$ placed in negative feedback between an output and the input—of the amplifier A1. When the resonator RE resonates at the fundamental frequency $F_0$, the amplifier A1 supplies at output a signal $v_R$ which is given by the relation:

$$v_R = U_D(\Delta C/C_R).\cos(\omega_0 t + \phi_1) = k_1 . V_a .\cos(\omega_0 t + \phi_1),$$

whereby $\Delta C$ is the maximal amplitude of the capacitance variation dC, $\omega_0$ the pulsation corresponding to the frequency $F_0$, $\phi_1$ a phase shifting introduced by the resonator RE and the amplifier A1 between the action signal $v_a V_a.\cos(\omega_0 t)$ and the signal $v_R$, and $k_1$ is a meter constant between the amplitudes of the signals $v_a$ and $v_R$.

The purpose of the phase shifter DE is to introduce a phase shift $\phi_{DE}$ in the signal $v_R$; phase shifter DE provides the signal:

$$v_{RD} = k_{DE}.k_1.V_a.\cos(\omega_0 t + \phi_1 + \phi_{DE}),$$ whereby $k_{DE}$ is an attenuation carried out on the signal by the phase shifter DE. The signal $v_{RD}$ is applied at an input of the amplifier A2.

The amplifier A2 is an amplifier with an adjustable gain G and a low output impedance. The amplifier A2 is e.g. like the amplifier A1, of the operational amplifier type. The amplifier A2 issues at output the signal $v_a$ supplied to the action electrode 2. Taking into account the gain G and a phase shifting $\phi_2$ introduced into the signal $v_{RD}$, the following relation ensues:

$$v_a = V_a.\cos(\omega_0 t) = G.k_{DE}.k_1.V_a.\cos(\omega_0 t + \phi_1 + \phi_{DE} + \phi_2).$$

From this relation are deducted the conventional gain and phase conditions for the maintenance of the oscillations of the oscillator:

$$G.k_{DE}.k_1 = 1$$

and $$\phi_1 + \phi_{DE} + \phi_2 = p.2.\pi,$$

whereby p is an integer.

The gain G and/or the coefficient $k_1$ are adjusted to satisfy the gain condition $G.k_{DE}.k_1 = 1$, the coefficient $k_1$ being adjustable by the choice of bias voltages $U_A$ and $U_D$. The phase shifter DE is devised so as to introduce a phase shifting $\phi_{DE}$ which satisfies the phase condition $\phi_1 + \phi_{DE} + \phi_2 = p.2.\pi$.

Figure 7:
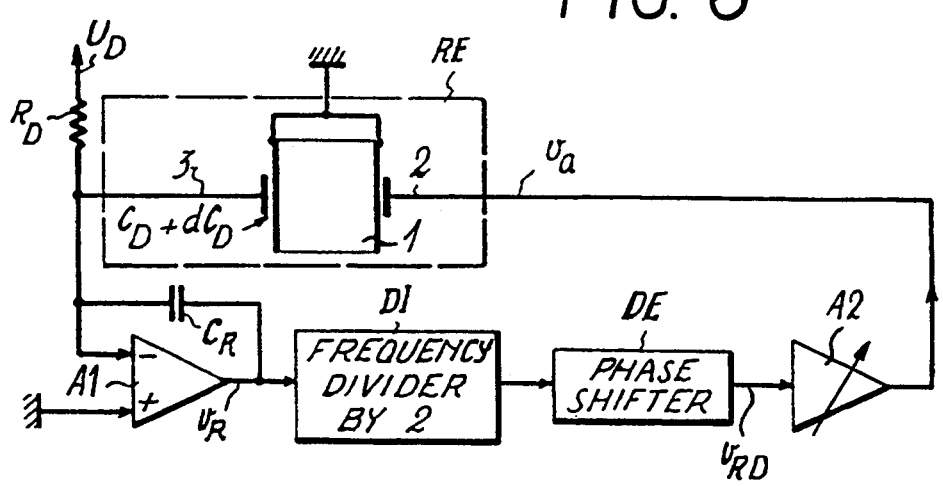
FIG. 7 is a circuit diagram of a second preferred embodiment of an oscillator in which an action electrode of the resonator is not biased with a d.c. voltage and in which a divide-by-2 frequency divider is included in the oscillator loop so as to offset a multiplication of the frequency by 2 introduced by the resonator.

In reference to FIG. 7, a second preferred embodiment of a high-stability oscillator implementing a resonator embodying the invention RE differs from the first preferred embodiment described above in that the action electrode 2 of the resonator RE is not biased at a d.c. voltage as the resistor $R_A$ is omitted, and in that a divided-by-2 frequency divider DI is introduced between the amplifiers A1 and A2, in cascade with the phase shifter DE.

As the action electrode 2 is not biased, the response from the resonator RE is quadratic and the amplifier A1 issues a sinusoidal signal $v_R$ whose frequency is twice the frequency of the action signal $v_a$. The frequency divider DI divides the frequency of the signal $v_R$ by 2 and thus offsets the multiplication of the frequency by 2 caused by the quadratic response of the resonator RE.

Various applications of the invention can, of course, be considered, such as e.g. the embodiment of force meters, pressure, acceleration or temperature sensors, using the plate resonator as sensing element.

What we claim is:

1. A resonator comprising a supporting base, a resonating solid elastic plate attached to said supporting base, at least one first electrode and at least one second electrode for respectively exciting said plate and for detecting plate vibrations, wherein said plate is excited in a contour vibration mode, said plate having a length which is an integral multiple of the width of said plate, wherein said electrodes do not adhere to said plate, said electrodes being located at the periphery of said plate at a short predetermined distance from said plate, said electrodes being opposite narrow edges of said plate and opposite vibration loops of the plate, and wherein said plate is attached to said supporting base at points corresponding to vibration nodes of said plate.

2. The resonator as claimed in claim 1, wherein said plate is a grounded surface-doped semiconductor.

3. The resonator as claimed in claim 1, wherein said plate is formed of insulating material, and further comprising metallized narrow edges connected to a reference ground opposite said electrodes.

4. The resonator as claimed in claim 1, wherein said plate is formed of insulating material, and wherein said supporting base comprises a conductive surface connected to a reference ground, said conductive surface being located with regard to said electrodes and said plate in such a way that said plate is traversed by the lines of an electric field between said electrodes and said conductive surface.

5. The resonator as claimed in claim 3, wherein said plate is formed of crystalline material of the cubic system, and wherein said plate is cut in such a way that the plane of said plate is perpendicular to a first crystallographic axis of said material and that the edges of said plate are oriented along one of two directions respectively parallel to and at an angle of 45° with respect to second and third crystallographic axes of the material.

6. The resonator as claimed in claim 5, wherein the material of said plate is selected from the group consisting of silicon and germanium.

7. The resonator as claimed in claim 5, wherein said plate is formed of piezoelectric material and is cut in such a way that said plane of said plate corresponds to an isotropic plane of the material.

8. A resonator as claimed in claim 1, wherein first and second sets of said first electrodes are included, means for applying an excitation signal to the first set of first electrodes at a first phase and for applying the excitation signal to the second set of said first electrodes at a phase displaced by $\pi$ from the first phase, said second set of first electrodes being opposite first vibration loops of said plate, said first set of first electrodes being opposite second vibration loops of said plate.

9. The resonator as claimed in claim 1, wherein said plate is a grounded electrical conductor.

10. A resonator comprising a supporting base, a solid elastic resonating plate attached to said supporting base, at least one first electrode and at least one second electrode for respectively exciting said plate in a contour vibration mode and for detecting plate vibrations, said plate having a length which is an integral multiple of the width of said plate, wherein said electrodes do not adhere to said plate, said electrodes being located at the periphery of said plate at a short predetermined distance from said plate, said electrodes being opposite narrow edges of said plate and opposite vibration loops of the plate, said plate being attached to said supporting base at points corresponding to vibration nodes of said plate, and wherein said vibration mode is a Lamé mode wherein volume acoustic waves are radiated in directions at 45° from said narrow edges of said plate.

11. An oscillator comprising a resonator, phase shifting means and amplifying means connected in a loop, and wherein said resonator includes: a supporting base, a resonating solid elastic plate attached to said supporting base, at least one first electrode and at least one second electrode for respectively exciting said plate and for detecting plate vibrations, wherein said plate is excited in a contour vibration mode, said plate having a length which is an integral multiple of the width of said plate, wherein said electrodes do not adhere to said plate, said electrodes being located at the periphery of said plate at a short predetermined distance from said plate, said electrodes being opposite narrow edges of said plate and opposite vibration loops of the plate, and wherein said plate is attached to said supporting base at points corresponding to vibration nodes of said plate.

12. An oscillator as claimed in claim 11 further comprising means responsive to said second electrodes for deriving a signal representative of a capacitance variation between said second electrode and a reference, said capacitance variation being due to vibrations of said plate of said resonator.

13. An oscillator as claimed in claim 11, further comprising means for respectively biasing said first and second electrodes of said resonator with first and second d.c. voltages.

14. An oscillator as claimed in claim 12 further comprising means for biasing said second electrode of said resonator with a d.c. voltage, and means, in cascade with said deriving means, for dividing by two the frequency of said signal representative of a capacitance variation between said second electrodes and said reference ground.

* * * * *